United States Patent
Debroy et al.

(10) Patent No.: US 11,962,298 B1
(45) Date of Patent: Apr. 16, 2024

(54) SYSTEM AND METHOD FOR NANOMAGNET BASED LOGIC DEVICE

(71) Applicant: Ceremorphic, Inc., San Jose, CA (US)

(72) Inventors: Sanghamitra Debroy, Hyderabad (IN); Akshaykumar Salimath, Hyderabad (IN); Venkat Mattela, San Jose, CA (US)

(73) Assignee: Ceremorphic, Inc., San Jose, CA (US)

( * ) Notice: Subject to any disclaimer, the term of this patent is extended or adjusted under 35 U.S.C. 154(b) by 135 days.

(21) Appl. No.: 17/829,091

(22) Filed: May 31, 2022

(51) Int. Cl.
| | | |
|---|---|---|
| *H03K 19/18* | (2006.01) | |
| *H01F 10/32* | (2006.01) | |
| *H03K 19/173* | (2006.01) | |
| *H10N 35/00* | (2023.01) | |
| *H10N 50/20* | (2023.01) | |
| *H10N 50/85* | (2023.01) | |

(52) U.S. Cl.
CPC ............ *H03K 19/18* (2013.01); *H01F 10/324* (2013.01); *H03K 19/173* (2013.01); *H10N 35/00* (2023.02); *H10N 50/20* (2023.02); *H10N 50/85* (2023.02)

(58) Field of Classification Search
CPC ........ G11C 11/15; H10N 50/10; H10N 50/85; H10N 35/00; H10N 50/20; H03K 19/173; H03K 19/20; H03K 19/16; H03K 19/21; H03K 19/18; H01F 10/329; H01F 10/3286; H01F 10/324
See application file for complete search history.

(56) References Cited

U.S. PATENT DOCUMENTS

| | | | | |
|---|---|---|---|---|
| 9,391,262 | B1 * | 7/2016 | Nikonov | G11C 11/1673 |
| 10,447,277 | B1 * | 10/2019 | Kazemi | H10N 50/80 |
| 10,497,416 | B2 * | 12/2019 | Sayed | H10N 50/10 |
| 11,211,548 | B2 * | 12/2021 | Sasaki | H10N 50/80 |
| 11,276,815 | B2 * | 3/2022 | Sasaki | H10N 50/85 |
| 11,522,124 | B2 * | 12/2022 | Sasaki | H10N 50/10 |
| 11,594,357 | B2 * | 2/2023 | Qoutb | H10N 50/85 |
| 11,700,001 | B1 * | 7/2023 | Debroy | H03K 19/18 |
| | | | | 326/104 |

* cited by examiner

*Primary Examiner* — Vibol Tan
(74) *Attorney, Agent, or Firm* — Minisandram Law Firm; Raghunath S. Minisandram

(57) ABSTRACT

A system and method for a logic device is disclosed. A first substrate, and a second substrate is provided, which are spaced apart from each other and manifests Spin orbit torque effect. A nanomagnet is disposed over the first substrate and the second substrate. A first charge current is passed through the first substrate and a second charge current is passed through the second substrate. A direction of flow of the first charge current and the second charge current defines an input value of either a first value or a second value. A spin in the nanomagnet is selectively oriented based on the direction of flow of the first charge current and the second charge current. The spin in the nanomagnet is selectively read to determine an output value as the first value or the second value. The logic device is configured as a XOR logic.

20 Claims, 5 Drawing Sheets

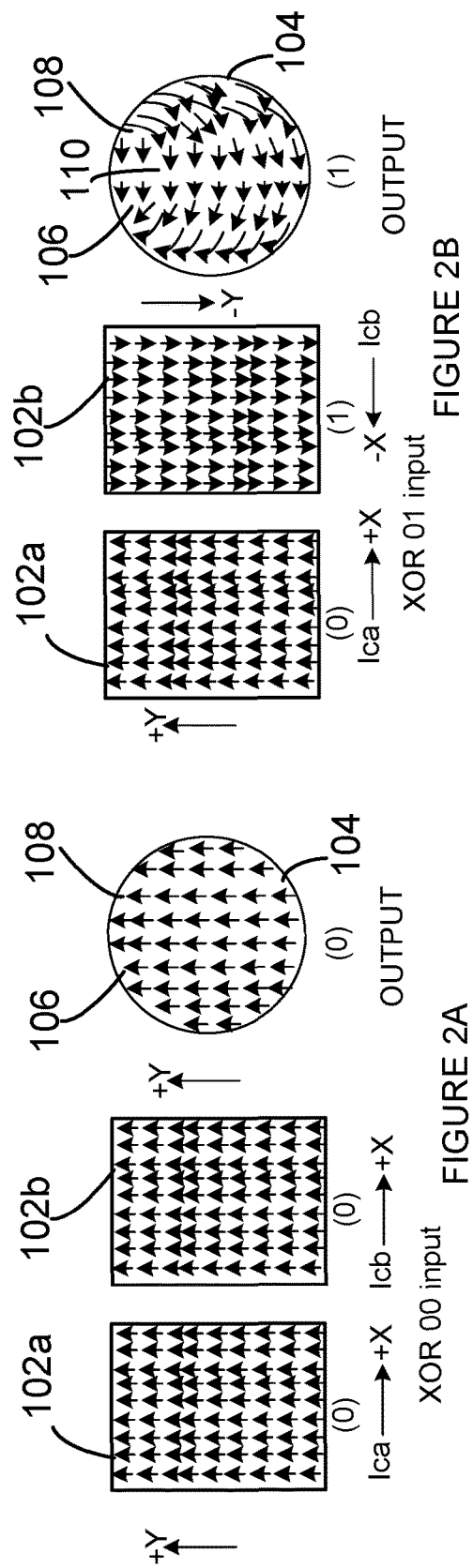
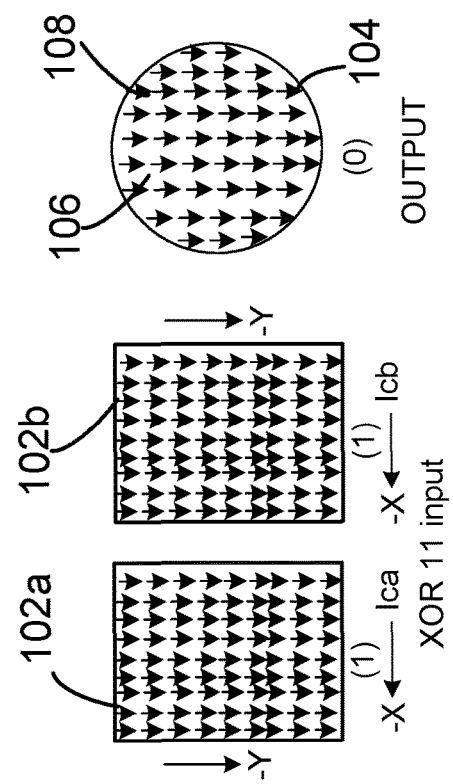
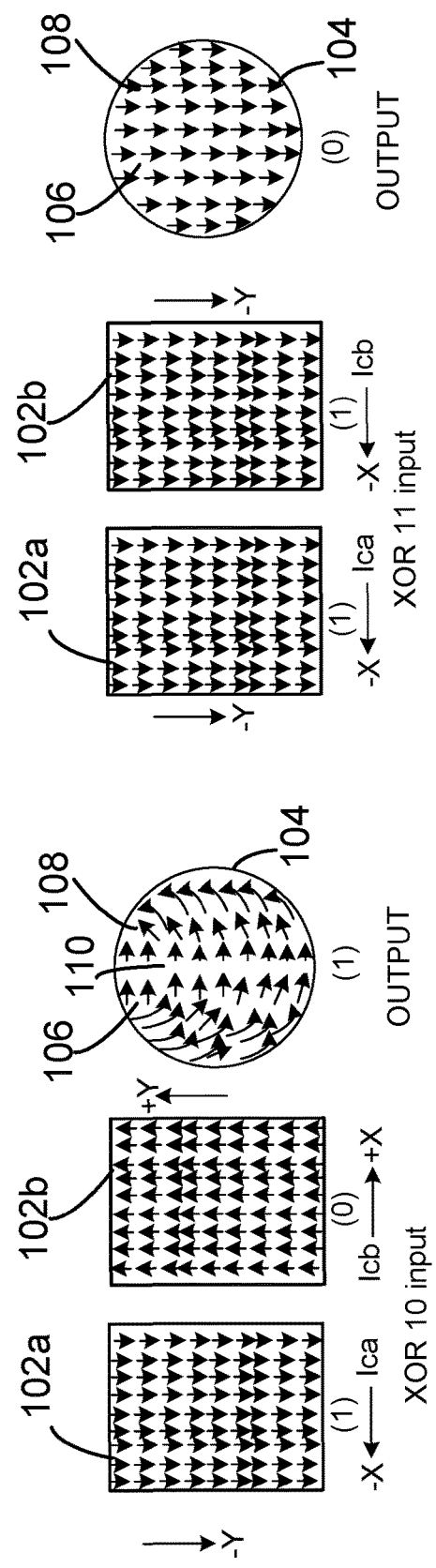

US 11,962,298 B1

SYSTEM AND METHOD FOR NANOMAGNET BASED LOGIC DEVICE

RELATED APPLICATION

None

TECHNICAL FIELD

The present invention relates generally to logic devices and more specifically, to nanomagnet based logic devices.

DESCRIPTION OF RELATED ART

The complementary metal-oxide semiconductor (CMOS) technology based logic devices are reaching their physical limits in terms of reliability and power consumption in current day application. Further, continued requirement for minimal power consumption in computing devices necessitates discovery of new logic devices that are conducive for mass adaptation in the computing devices. With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method is disclosed. A first substrate, and a second substrate is provided, which are spaced apart from each other. A nanomagnet is disposed over the first substrate and the second substrate. A first charge current is passed through the first substrate and a second charge current is passed through the second substrate. A direction of flow of the first charge current and the second charge current defines an input value of either a first value or a second value. A spin in the nanomagnet is selectively oriented based on the direction of flow of the first charge current and the second charge current. The spin in the nanomagnet is selectively read to determine an output value as the first value or the second value. In one example, the logic device is configured as a XOR logic.

In another embodiment, a logic device is disclosed. A first substrate, and a second substrate is provided, which are spaced apart from each other. A nanomagnet is disposed over the first substrate and the second substrate. A first charge current is passed through the first substrate and a second charge current is passed through the second substrate. A direction of flow of the first charge current and the second charge current defines an input value of either a first value or a second value. A spin in the nanomagnet is selectively oriented based on the direction of flow of the first charge current and the second charge current. The spin in the nanomagnet is selectively read to determine an output value as the first value or the second value. In one example, the logic device is configured as a XOR logic.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following figures:

FIGS. 2A, 2B, 2C, and 2D show various inputs and corresponding output states of the logic device implementing a XOR (Exclusive OR) logic, according to one aspect of the present disclosure;

DETAILED DESCRIPTION

To facilitate an understanding of the adaptive aspects of the present disclosure, an example logic device will be described. The specific construction and operation of the adaptive aspects of various elements of the example logic device is also described.

Figure 1:
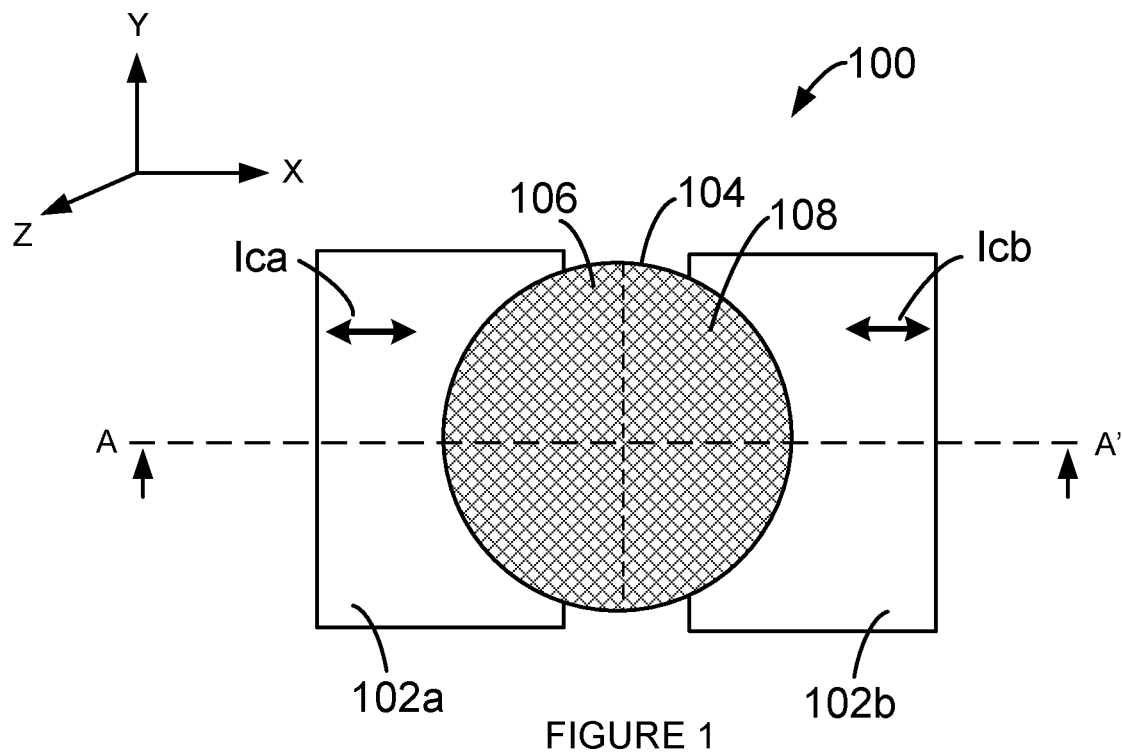
FIGS. 1 and 1A show an example logic device, according to one aspect of the present disclosure.
Figure 1A:
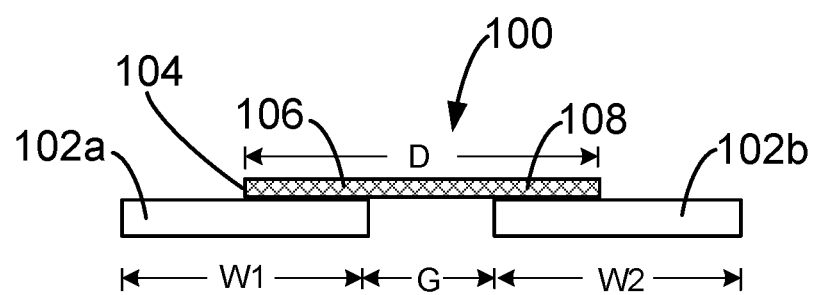

FIG. 1 shows a plan view of an example logic device 100. FIG. 1A shows a cross-sectional view of the logic device 100, along line A-A'. Now, referring to FIGS. 1 and 1A, the logic device 100 includes a first substrate 102a, a second substrate 102b, and a nanomagnet 104. The first substrate 102a, and the second substrate 102b are conductive metal layers. The first substrate 102a and the second substrate 102b are substantially made of heavy metal, such as an alloy of β-Tantalum (β-Ta), Platinum (Pt), or β-Tungsten (β-W) or an alloy of heavy metal. In one example, the heavy metal exhibits spin orbit torque effect. In one example, first substrate 102a and the second substrate 102b are each a layer of thin film with a very large spin hall angle, such as a layer of thin film of β-Tantalum (β-Ta), Platinum (Pt), or β-Tungsten (β-W) or an alloy of β-Tantalum (β-Ta), Platinum (Pt), or β-Tungsten (β-W). The first substrate 102a, and the second substrate 102b are configured to receive a charge current and convert the charge current into a spin current, through spin Hall effect. For example, the first substrate 102a receives a first charge current Ica, and the second substrate 102b receives a second charge current Icb.

The thickness of first substrate 102a, and the second substrate 102b may be selected in the range of 2-5 nm so as to have a charge current density of about $7.5e^{12}$ Amperes/meter$^2$ through each of the first substrate 102a, and the second substrate 102b. As one skilled in the art appreciates, the first substrate 102a, and the second substrate 102b may be deposited on a base layer (not shown). In some examples, base layer may be a silicon wafer.

In one example, a width W1 of the first substrate 102a may be of the order of about 8-10 nm. Similarly, a width W2 of the second substrate 102b may be of the order of about 8-10 nm. Further, the first substrate 102a and second substrate 102b are spaced apart with each other, with a gap G of about 5 nm. A thickness of the first substrate 102a and the second substrate 102b is about 2-5 nm. A diameter D of the nanomagnet 104 may be of the order of 8 nm to about 20 nm.

A thickness of the nanomagnet 104 may be of the order of 3 nm. A length L of the first substrate 102a and the second substrate 102b is at least as large as the diameter D of the nanomagnet 104. In one example, the length L may be of the order of about 10-20 nm. The nanomagnet 104 is made up of an alloy of Cobalt and Iron (CoFe) material.

The nanomagnet 104 is disposed over the first substrate 102a and the second substrate 102b, such that substantial portion of the first half 106 is disposed over the first substrate 102a and substantial portion of the second half 108 is disposed over the second substrate 102b.

Having generally described the construction of the logic device 100, example general operation of the logic device 100 will now be described, with reference to FIG. 1. The orientation of the first half 108 of the magnetic domain of the nanomagnet 104 is selectively set by passing the first charge current Ica. The orientation of the magnetic domain in the first half 108 of the nanomagnet 104 depends upon the direction of flow of the first charge current Ica.

For example, when the first charge current Ica flows through the first substrate 102a in the +X direction, it will inject pure spin current in the Z direction through the spin Hall effect. The direction of current Ica in +X direction results in the electron polarized along the +Y direction. The magnetization of the first half 106 of the nanomagnet 104 is subjected to the spin injection torque, resulting in magnetization switching, indicative of an orientation of the magnetic domain. The direction (+X or −X) of the charge current Ica will determine the orientation of the magnetic domain in the first half 106 of the nanomagnet 104 adjacent the first substrate 102a. In one example, the direction of flow of first charge current Ica in the +X direction may indicate a first value, for example, logical value of 0, and the direction of flow of the first charge current Ica in the −X direction may indicate a second value, for example, logical value of 1.

Similarly, when the second charge current Icb flows through the second substrate 102b in the +X direction, it will inject pure spin current in the Z direction through the spin Hall effect. The direction of current Icb in +X direction results in the electron polarized along the +Y direction. The magnetization of the second half 108 of the nanomagnet 104 is subjected to the spin injection torque, resulting in magnetization switching, indicative of an orientation of the magnetic domain. The direction (+X or −X) of the charge current Icb will determine the orientation of the magnetic domain in the second half 108 of the nanomagnet 104 adjacent the second substrate 102b. In one example, the direction of flow of first charge current Ica in the +X direction may indicate a first value, for example, logical value of 0, and the direction of flow of the second charge current Icb in the −X direction may indicate a second value, for example, logical value of 1.

The induced magnetization direction of the nanomagnet 104 is selectively set due to spin orbit coupling effect by the first charge current Ica flowing through the first substrate 102a, and the second charge current Icb flowing through the second substrate 102b. In some examples, induced magnetic direction will result in a single domain state. In some examples, induced magnetic direction will result is a multidomain state. This will be further explained with respect to FIGS. 2A-2D.

FIGS. 2A, 2B, 2C, and 2D represent an example implementation of a XOR logic. In this example, the direction of the flow of the charge currents, for example, the first charge current Ica and second charge current is selected to indicate a logical value of 0 or 1.

Now, referring to FIG. 2A, first substrate 102a, and the second substrate 102b are shown. In this example, the direction of flow of first charge current Ica in the first substrate 102a is selected to indicate a value of 0 (Ica flow in +X direction), which results in magnetic spins pointing upwards (+Y) in the first substrate 102a. This will generate a magnetic spin pointing upwards (+Y) in the first half 106 of the nanomagnet 104. Similarly, the direction of flow of second charge current Icb in the second substrate 102b is selected to indicate a value of 0 (Icb flow in +X direction), which results in magnetic spins pointing upwards (+Y) in the second substrate 102b. This will generate a magnetic spin pointing upwards (+Y) in the second half 108 of the nanomagnet 104. Based on the direction of magnetic spins in the first half 106 and second half 108 of the nanomagnet 104 will together result in a total magnetic spin pointing upwards, resulting in a single domain magnetic state. In order to represent an output value of {{0}} for an input value of {{0,0}} indicative of the XOR operation, presence of single magnetic domain is sensed and concluded to be an output value of 0.

Now, referring to FIG. 2B, first substrate 102a, and the second substrate 102b are shown. In this example, the direction of flow of first charge current Ica in the first substrate 102a is selected to indicate a value of 0 (Ica flow in +X direction), which results in magnetic spins pointing upwards (+Y) in the first substrate 102a. This will generate a magnetic spin pointing upwards (+Y) in the first half 106 of the nanomagnet 104. Similarly, the direction of flow of second charge current Icb in the second substrate 102b is selected to indicate a value of 1 (Icb flow in −X direction), which results in magnetic spins pointing downwards (−Y) in the second substrate 102b. This will generate a magnetic spin pointing downwards (−Y) in the second half 108 of the nanomagnet 104. Based on the direction of magnetic spins in the first half 106 and second half 108 of the nanomagnet 104 will together result in a total magnetic spin pointing in a clockwise direction, with a domain wall 110 formed about the center of the nanomagnet 104, resulting in a multidomain (in this example, a dual domain), with a first domain in the first half 106 of the nanomagnet 104 and a second domain in the second half 108 of the nanomagnet, both oriented in a clockwise direction. In order to represent an output value of {{1}} for an input value of {{0,1}} indicative of the XOR operation, presence of dual magnetic domain is sensed and concluded to be an output value of 1.

Now, referring to FIG. 2C, first substrate 102a, and the second substrate 102b are shown. In this example, the direction of flow of first charge current Ica in the first substrate 102a is selected to indicate a value of 1 (Ica flow in −X direction), which results in magnetic spins pointing upwards (−Y) in the first substrate 102a. This will generate a magnetic spin pointing downwards (−Y) in the first half 106 of the nanomagnet 104. Similarly, the direction of flow of second charge current Icb in the second substrate 102b is selected to indicate a value of 0 (Icb flow in +X direction), which results in magnetic spins pointing upwards (+Y) in the second substrate 102b. This will generate a magnetic spin pointing upwards (+Y) in the second half 108 of the nanomagnet 104. Based on the direction of magnetic spins in the first half 106 and second half 108 of the nanomagnet 104 will together result in a total magnetic spin pointing in an anticlockwise direction, with a domain wall 110 formed about the center of the nanomagnet 104, resulting in a multidomain (in this example, a dual domain), with a first domain in the first half 106 of the nanomagnet 104 and a second domain in the second half 108 of the nanomagnet, both oriented in an anticlockwise direction. In order to represent an output value of {{1}} for an input value of {{1,0}} indicative of the XOR operation, presence of dual magnetic domain is sensed and concluded to be an output value of 1.

Now, referring to FIG. 2D, first substrate 102a, and the second substrate 102b are shown. In this example, the direction of flow of first charge current Ica in the first substrate 102a is selected to indicate a value of 1 (Ica flow in −X direction), which results in magnetic spins pointing downwards (−Y) in the first substrate 102a. This will generate a magnetic spin pointing downwards (−Y) in the first half 106 of the nanomagnet 104. Similarly, the direction of flow of second charge current Icb in the second substrate 102b is selected to indicate a value of 1 (Icb flow in −X direction), which results in magnetic spins pointing downwards (−Y) in the second substrate 102b. This will generate a magnetic spin pointing downwards (−Y) in the second half 108 of the nanomagnet 104. Based on the direction of magnetic spins in the first half 106 and second half 108 of the nanomagnet 104 will together result in a total magnetic spin pointing downwards, resulting in a single domain. In order to represent an output value of {{0}} for an input value of {{1,1}} indicative of the XOR operation, presence of single magnetic domain is sensed and concluded to be an output value of 0.

Figure 3A:
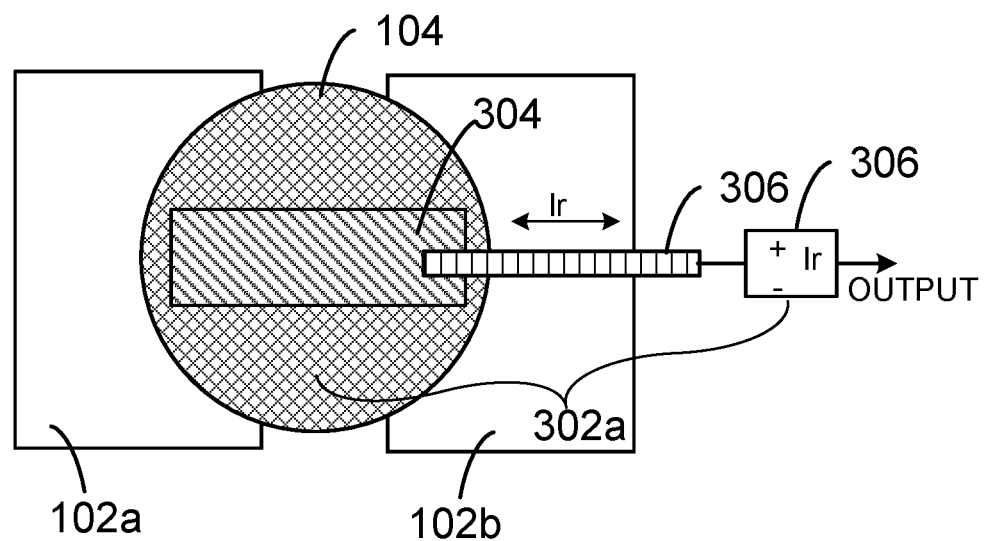
FIG. 3A shows an example read circuit to read the output state of the logic device, according to one aspect of the present disclosure.

As one skilled in the art appreciate, a reading circuit may be operatively disposed relative to the nanomagnet 104 to selectively determine the output value of the logic device 100. Now, referring to FIG. 3A, an example reading circuit 302a is disclosed. The reading circuit 302a includes a reading strip 304, a conductor 306, and a mod value generator 308. In one example, the reading strip 304 is an inverse spin orbit charge (ISOC) material. A read current Ir is induced in the reading strip 304, based on the status of the nanomagnet 104. The read current Ir is then fed to the mod value generator 308 to indicate a modulus value of the induced current Ir.

When the nanomagnet 104 has a single domain (as described with reference to FIGS. 2A and 2D), a first read current Ir1 is induced in the reading strip, direction of which will depend upon the orientation of the spin (either +Y or −Y). Therefore, the input of the mod value generator 308 will be either +Ir1 (if the orientation of the spin is in +Y direction) or −Ir1 (if the orientation of the spin is in −Y direction). The output of the mod value generator 308 will be a modulus of the input value, in this case, Ir1. Based on the value of the Ir1, it will be concluded that the output value is a 1.

When the nanomagnet 104 has a dual domain (as described with reference to FIGS. 2B and 2C), a second read current Ir2 is induced in the reading strip, direction of which will depend upon the orientation of the spin (either clockwise or anti-clockwise). Further, the value of the second read current Ir2 will be less that the value of the first read current Ir1, due to the multidomain state. Therefore, the input of the mod value generator 308 will be either +Ir2 or −Ir2. The output of the mod value generator 308 will be a modulus of the input value, in this case, Ir2. Based on the value of the Ir2 which will be less than the value of the Ir1, it will be concluded that the output value is a 0. In one example, the mod value generator 308 may be a precision rectifier. As one skilled in the art appreciates, by using the mod value generator 308, the output of the device can be propagated to other logic devices for further processing.

Figure 3B:
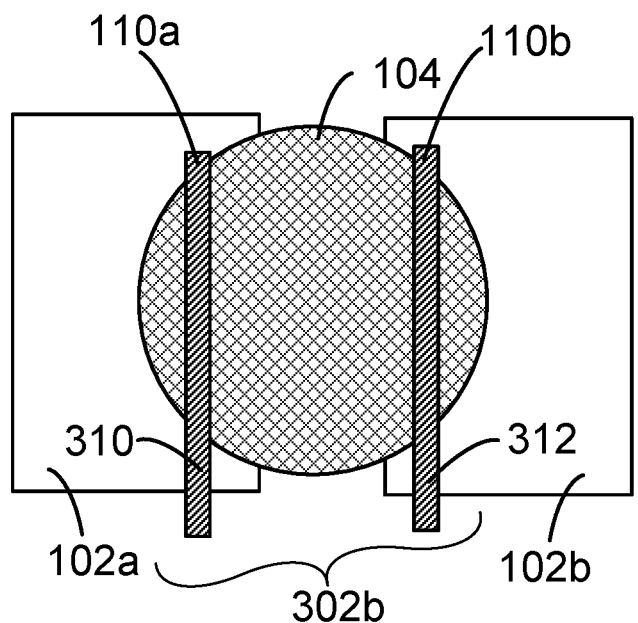
FIG. 3B shows another example read circuit to read the output state of the logic device, according to one aspect of the present disclosure.

Now, referring to FIG. 3B, another example reading circuit 302b is disclosed. The reading circuit 302b includes a first read electrode 310 and a second read electrode 312. The first read electrode 310 is disposed over the first half 106 of the nanomagnet 104. The second read electrode 312 is disposed over the second half 108 of the nanomagnet 104. A resistance between the first read electrode 310 and the second read electrode 312 is measured. When the nanomagnet 104 has a single domain, the magnetoresistance measured across the first read electrode 310 and the second read electrode 312 will be lower than when the nanomagnet 104 has a dual domain. Thus, by measuring the magnetoresistance between the first read electrode 310 and second read electrode 312, we can conclude that the output value is a 0, when the magnetoresistance is high and we can conclude that the output value is a 1 when the magnetoresistance is low. The difference in the magnetoresistance depends on the dimensions of the nanomagnet 104.

Figure 4:
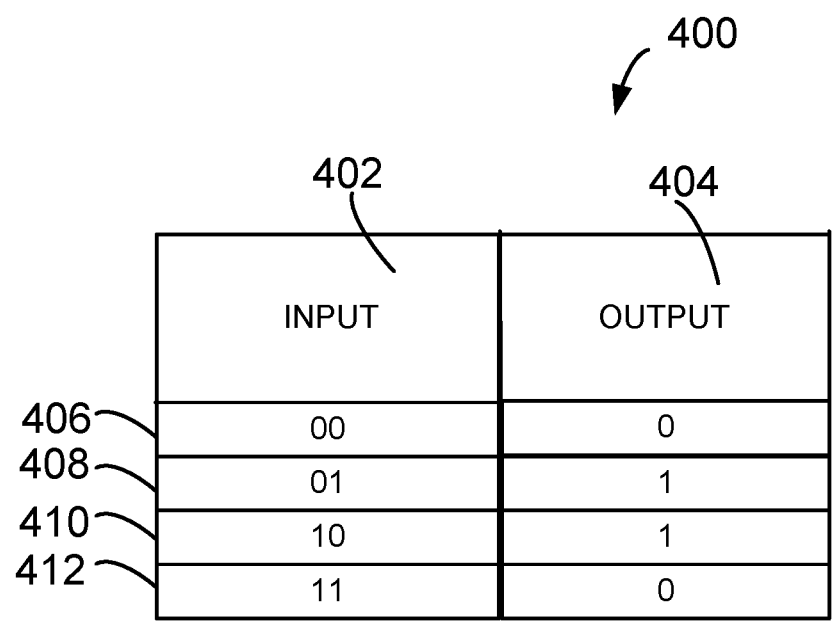
FIG. 4 shows an example table, showing various inputs to the logic device and corresponding outputs of the logic device, according to one aspect of the present disclosure.

Now, referring to FIG. 4, an example table 400 is described. Column 402 shows various inputs to the first substrate 102a, and the second substrate 102b. Column 404 shows various outputs of the nanomagnet 104, based on various inputs. Rows 406, 408, 410, and 412 show various inputs and corresponding outputs of the logic device, implementing an XOR logic, as previously described with reference to FIGS. 2A, 2B, 2C, and 2D respectively.

Figure 5:
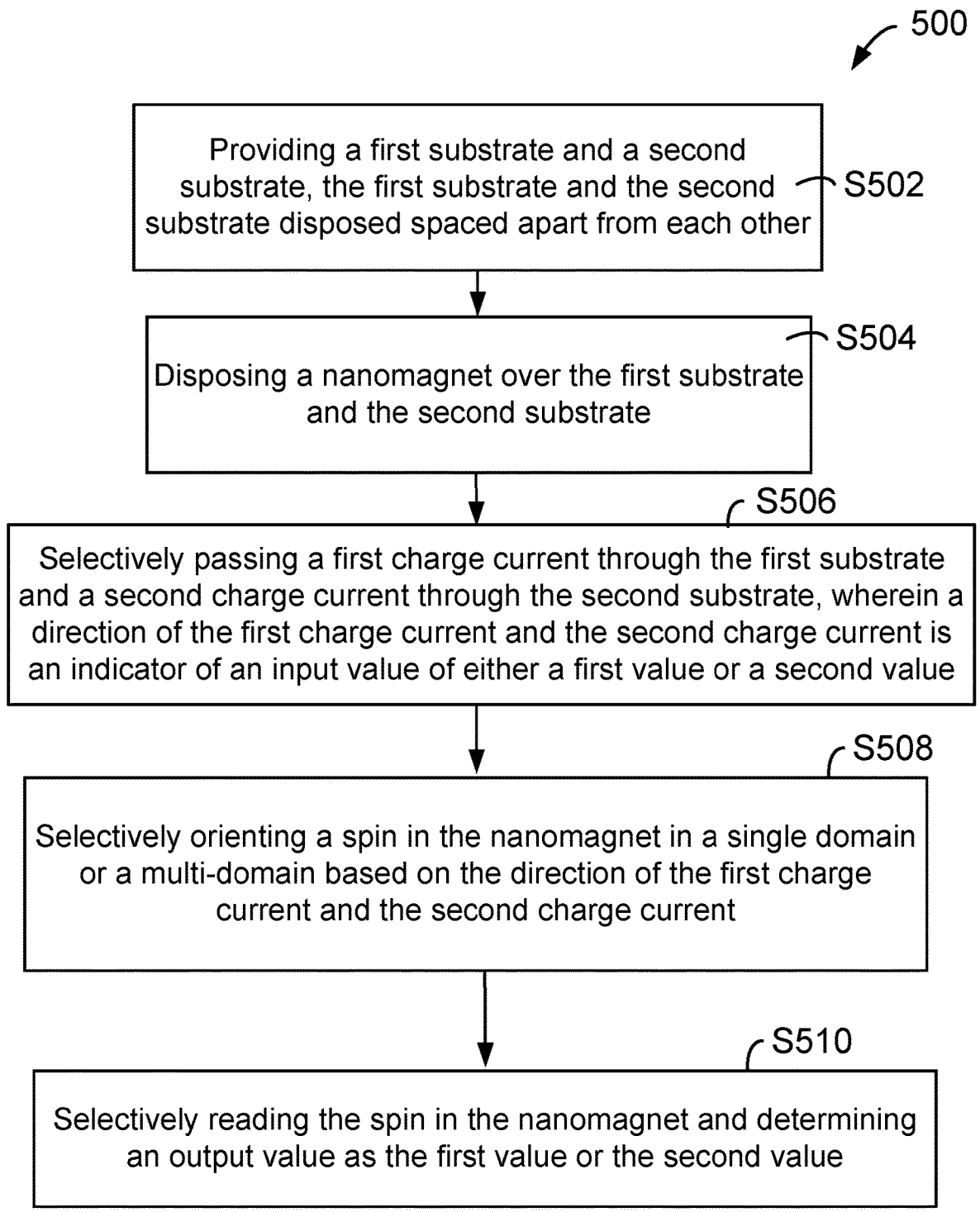
FIG. 5 shows an example flow diagram, according to one aspect of the present disclosure.

Now, referring to FIG. 5, an example flow diagram 500 is described. In block S502, a first substrate, and a second substrate is provided, wherein the first substrate and the second substrate are disposed spaced apart from each other. For example, first substrate 102a, and second substrate 102b are provided, as previously described with reference to FIGS. 1 and 1A.

In block S504, a nanomagnet is disposed over the first substrate, and the second substrate. For example, a nanomagnet 104 is disposed over the first substrate 102a, and the second substrate 102b.

In block S506, a first charge current is selectively passed through the first substrate and a second charge current is selectively passed through the second substrate, wherein a direction of the flow of the first charge current and the second charge current is an indicator of an input value of either a first value or a second value. For example, first charge current Ica and second charge current Icb are passed through the first substrate 102a and the second substrate 102b. A direction of flow of the first charge current Ica and the second charge current Icb in +X direction is indicative of a first value of 0. A direction of flow of the first charge current Ica and the second charge current Icb in −X direction is indicative of a second value of 1.

In block S508, a spin is selectively oriented in the nanomagnet, based on the direction of the first charge current and the second charge current. For example, a single domain is formed in the nanomagnet 104, when the direction of flow of the first charge current Ica and the second charge current Icb are same. And, a multidomain (for example, a dual domain) is formed in the nanomagnet 104, when the direction of flow of the first charge current Ica and the second charge current Icb are opposite to each other.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments.

It is to be understood that phraseology or terminology employed herein is for the purpose of description and not of limitation.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method, including:
providing a first substrate, and a second substrate that exhibits spin orbit coupling effect, the first substrate and the second substrate disposed spaced apart from each other;
disposing a nanomagnet over the first substrate and the second substrate;
selectively passing a first charge current through the first substrate and a second charge current through the second substrate, wherein a direction of the flow of the first charge current and the second charge current is an indicator of an input value of either a first value or a second value;
selectively orienting a spin in the nanomagnet based on the direction of flow of the first charge current and the second charge current;
selectively reading the spin in the nanomagnet and determining an output value as the first value or the second value.

2. The method of claim 1, wherein, the spin in the nanomagnet forms either a single domain or a multi-domain, based on the direction of flow of the first charge current and the second charge current.

3. The method of claim 2, further including a reading circuit, to read the output value.

4. The method of claim 3, wherein, the reading circuit including a reading strip disposed over the nanomagnet, wherein a read current is induced in the reading strip, due to the spin in the nanomagnet.

5. The method of claim 4, wherein the reading strip is an inverse spin orbit charge coupled material.

6. The method of claim 5, wherein, a value of the charge current is indicative of the output of either the first value or the second value.

7. The method of claim 3, wherein the reading circuit includes a first read electrode disposed over the nanomagnet, about the first substrate and a second read electrode disposed over the nanomagnet, about the second substrate, and a resistance value measured between the first read electrode and the second read electrode is indicative of the output value.

8. The method of claim 7, wherein a low resistance value is indicative of the first value and a high resistance value is indicative of the second value.

9. The method of claim 1, wherein,
a width of the first substrate, and the second substrate is of the order of about 8-10 nm and a gap between the first substrate and the second substrate is of the order of about 5 nm; and
a diameter of the nanomagnet is of the order of about 8-20 nm.

10. The method of claim 1, wherein, the first substrate, and the second substrate are each composed of a heavy metal,
wherein, the first charge current, and the second charge current each produce a spin orbit torque in the first substrate, and the second substrate and drives an orientation of magnetic field in the nanomagnet.

11. A logic device, including:
a first substrate, and a second substrate, the first substrate and the second substrate disposed spaced apart from each other;
a nanomagnet is disposed over the first substrate and the second substrate;
a first charge current is selectively passed through the first substrate and a second charge current is selectively passed through the second substrate, wherein a direction of the flow of the first charge current and the second charge current is an indicator of an input value of either a first value or a second value;
a spin is oriented in the nanomagnet based on the direction of flow of the first charge current and the second charge current;
the oriented spin in the nanomagnet is selectively read to determining an output value as the first value or the second value.

12. The logic device of claim 11, wherein, the spin in the nanomagnet is either a single domain or a multi-domain, based on the direction of flow of the first charge current and the second charge current.

13. The logic device of claim 12, further including a reading circuit, to read the output value.

14. The logic device of claim 13, wherein, the reading circuit includes a reading strip disposed over the nanomagnet, wherein a charge current is induced in the reading strip, due to the spin in the nanomagnet.

15. The logic device of claim 14, wherein the reading strip is an inverse spin orbit charge material.

16. The logic device of claim 15, wherein, a value of the charge current is indicative of the output of either the first value or the second value.

17. The logic device of claim 13, wherein the reading circuit includes a first read electrode disposed over the nanomagnet, about the first substrate and a second read electrode disposed over the nanomagnet, about the second substrate, and a resistance value measured between the first read electrode and the second read electrode is indicative of the output value.

18. The logic device of claim 17, wherein a low resistance value is indicative of the first value and a high resistance value is indicative of the second value.

19. The logic device of claim 11, wherein,
a width of the first substrate, and the second substrate is of the order of about 8-10 nm and a gap between the first substrate and the second substrate is of the order of about 5 nm; and
a diameter of the nanomagnet is of the order of about 8-20 nm.

20. The logic device of claim 1, wherein, the first substrate, and the second substrate are each composed of a Spin orbit material leading to spin hall effect,
wherein, the first charge current, and the second charge current each produce a spin orbit torque in the first substrate, and the second substrate and drives an orientation of magnetic field in the nanomagnet.

* * * * *